(12) United States Patent
Sharon et al.

(10) Patent No.: US 12,294,216 B2
(45) Date of Patent: May 6, 2025

(54) DYNAMIC GRAPH FOR DATA PROPAGATION

(71) Applicant: S&C Electric Company, Chicago, IL (US)

(72) Inventors: Yoav Sharon, Evanston, IL (US); Qing Guo, Skokie, IL (US)

(73) Assignee: S&C Electric Company, Chicago, IL (US)

( * ) Notice: Subject to any disclaimer, the term of this patent is extended or adjusted under 35 U.S.C. 154(b) by 505 days.

(21) Appl. No.: 17/677,885

(22) Filed: Feb. 22, 2022

(65) Prior Publication Data

US 2022/0269234 A1  Aug. 25, 2022

Related U.S. Application Data

(60) Provisional application No. 63/153,657, filed on Feb. 25, 2021.

(51) Int. Cl.

| | |
|---|---|
| *H02J 3/06* | (2006.01) |
| *G01R 19/25* | (2006.01) |
| *G01R 31/08* | (2020.01) |
| *G05B 19/042* | (2006.01) |
| *H02J 3/08* | (2006.01) |
| *H02J 3/14* | (2006.01) |
| *H04L 41/12* | (2022.01) |
| *H04L 67/12* | (2022.01) |

(52) U.S. Cl.
CPC ............ *H02J 3/06* (2013.01); *G01R 19/2513* (2013.01); *G01R 31/086* (2013.01); *G05B 19/042* (2013.01); *H02J 3/08* (2013.01); *H02J 3/144* (2020.01); *H04L 41/12* (2013.01); *H04L 67/12* (2013.01); *G05B 2219/2639* (2013.01)

(58) Field of Classification Search
CPC .. H02J 3/06; H02J 3/144; H04L 41/12; G01R 19/2513; G01R 31/086
See application file for complete search history.

(56) References Cited

U.S. PATENT DOCUMENTS

| | | | |
|---|---|---|---|
| 6,061,609 A | 5/2000 | Kanoi et al. | |
| 2011/0035067 A1 | 2/2011 | Larsson et al. | |
| 2012/0265360 A1* | 10/2012 | Smit | H02H 7/262 |
| | | | 700/293 |
| 2021/0036508 A1 | 2/2021 | Quinlan et al. | |

OTHER PUBLICATIONS

International Search Report and Written Opinion for International Application No. PCT/US2022/17364 dated Aug. 3, 2022. (11 pages).

\* cited by examiner

*Primary Examiner* — Mark A Connolly (57) ABSTRACT

A system and method for representing the topology of a power distribution network, where the network includes at least one power source, a feeder and a plurality of switching devices positioned along the feeder. The method includes providing a device list in each switching device that includes a local device index of each of the switching devices, a local team index of the team on an X-side of each of the switching devices, the local team index of the team on a Y-side of each of the switching devices and device specific data, where the X and Y-sides of the switching device is the physical orientation of the device when it is installed, and providing a team list in each switching device that includes the local team index of each of the teams, the local device indices of the switching devices on each team and team specific data.

20 Claims, 2 Drawing Sheets

DYNAMIC GRAPH FOR DATA PROPAGATION

CROSS-REFERENCE TO RELATED APPLICATION

This application claims the benefit of priority from the U.S. Provisional Application No. 63/153,657, filed on Feb. 25, 2021, the disclosure of which is hereby expressly incorporated herein by reference for all purposes.

BACKGROUND

Field

The present disclosure relates generally to a system and method for representing a topology of a power distribution network and, more particularly, to a system and method for representing the topology of a power distribution network having a plurality of switching device.

Discussion of the Related Art

An electrical power network, often referred to as an electrical grid, typically includes power generation plants each having power generators, such as gas turbines, nuclear reactors, coal-fired generators, hydro-electric dams, etc. The power plants provide power at medium voltages that are then stepped up by transformers to a high voltage AC signal to be connected to high voltage transmission lines that deliver electrical power to substations typically located within a community, where the voltage is stepped down to a medium voltage for distribution. The substations provide the medium voltage power to three-phase feeders including three single-phase feeder lines that carry current 120° apart in phase. three-phase and single-phase lateral lines are tapped off of the feeder that provide the medium voltage to various distribution transformers, where the voltage is stepped down to a low voltage and is provided to loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that increases the load on the network, which may cause the current flow from the substation to significantly increase, for example, many times above the normal current, along the fault path. This amount of current causes the electrical lines to significantly heat up and possibly melt, and also could cause mechanical damage to various components in the substation and in the network. Many times the fault will be a temporary or intermittent fault as opposed to a permanent or bolted fault, where the thing that caused the fault is removed a short time after the fault occurs, for example, a lightning strike, and where the distribution network will almost immediately begin operating normally.

Fault interrupters, for example, reclosers that employ vacuum interrupters, are provided on utility poles and in underground circuits along a power line and have a switch to allow or prevent power flow downstream of the recloser. These reclosers detect the current and voltage on the line to monitor current flow and look for problems with the network circuit, such as detecting a fault. If fault current is detected the recloser is opened in response thereto, and then after a short delay closed to determine whether the fault is a temporary fault. If fault current flows when the recloser is closed, it is immediately opened. If the fault current is detected again or two more times during subsequent opening and closing operations indicating a permanent fault, then the recloser remains open, where the time between detection tests may increase after each test. For a typical reclosing operation for fault detection tests, about 3-6 cycles of fault current pass through the recloser before it is opened.

When a fault is detected, it is desirable that the first fault interrupter upstream from the fault be opened as soon as possible so that the fault is quickly removed from the network so that the loads upstream of that fault interrupter are not disconnected from the power source and service is not interrupted to them. It is further desirable that if the first fault interrupter upstream from the fault does not open for whatever reason, then a next fault interrupter upstream from the fault is opened, and so on. In order to accomplish this, it is necessary that some type of communications or coordination protection scheme be employed in the network so that the desired fault interrupter is opened in response to the fault.

A sectionalizer is a self-contained, circuit-opening device used in combination with source-side protective devices, such as reclosers or circuit breakers, to automatically isolate faulted sections of an electrical distribution network. A faulted circuit indicator is a device that automatically detects and identifies faults in an electrical distribution network, but does not have switching capabilities to open a power line. The devices are typically distributed between and among the reclosers to provide a system for isolating smaller sections of the network in response to a fault. Faulted circuit indicators and sectionalizers rely on observing a sequence of fault currents and the presence and absence of voltage either to indicate the presence of a fault or count the number of reclosing attempts, and then perform circuit isolation sectionalizing when the desired number of reclosing attempts has been reached. Existing power distribution circuit sectionalizers detect the passage of fault currents, including both the initial fault event and subsequent recloser-initiated events, as part of more elaborate fault isolation and restoration processes. These processes may include counting discrete intervals of fault current passage, or counting discrete intervals of voltage presence and absence.

Modern power distribution networks of the type being discussed herein usually operate as intelligent distribution automation systems, i.e., provide intelligent control over electrical power grid functions to the distribution level and beyond, where the many of the devices talk to each other and perform functions based on received information and data. These systems require device control that needs to have knowledge of the system topology, i.e., the architecture, for automation tasks, where the main purpose of the knowledge dissemination is to enable automatic power restoration in response to faults. For example, to decide what extra network sections alternative power sources can power, the automatic power restoration will need the relevant network information, such as power being consumed in each section.

In existing distribution automation systems, the system topology needs to be manually pushed to the devices for distributed control or a control center for centralized control, both at deployment and every time the topology of the network changes. In other words, the topology of the system needs to be manually loaded into each device, and thus the topology stored in each device is not automatically changed when the topology changes from devices being added to or removed from the network or when switching events occur to isolate faults. This not only requires a significant amount of engineering work, but also complicates the logic when the system topology changes due to automated operations. Further, if a switching device automatically opens, such as in response to a fault, other devices may not be made aware of this switching.

SUMMARY

The following discussion discloses and describes a system and method for representing the topology of a power distribution network, where the network includes at least one power source, at least one feeder and a plurality of switching devices positioned along the feeder(s) that are in communications with each other. The network is represented by a plurality of teams where each team includes one side of adjacent switching devices and loads and power line sections therebetween. The method includes identifying each of the switching devices with a local device index and identifying each of the teams with a local team index. The method also includes providing a device list in each switching device that includes the local device index of each of the switching devices, the local team index of the team on an X-side of each of the switching devices, the local team index of the team on a Y-side of each of the switching devices and device specific data, where the X and Y-sides of the switching device is the physical orientation of the device when it is installed. The method also includes providing a team list in each switching device that includes the local team index of each of the teams, the local device indices of the switching devices on each team and team specific data. The topology of the network can be obtained in each switching device by either the device list or the team list. The method further includes automatically updating and revising the device list and the team list by transmitting messages between and among the switching devices with information and data in the device list and the team list of one or more of the switching devices.

Additional features of the present disclosure will become apparent from the following description and appended claims, taken in conjunction with the accompanying drawings.

DETAILED DESCRIPTION OF THE EMBODIMENTS

The following discussion of the embodiments of the disclosure directed to a system and method for representing the topology of a power distribution network having a plurality of switching devices, where the method includes providing a device list in each switching device that includes a local device index of each of the switching devices, a local team index of the team on an X-side of each of the switching devices, the local team index of the team on a Y-side of each of the switching devices and device specific data and providing a team list in each switching device that includes the local team index of each of the teams, the local device indices of the switching devices on each team and team specific data is merely exemplary in nature, and is in no way intended to limit the disclosure or its applications or uses.

This disclosure proposes providing a dynamic graph representation for robust data dissemination between switching devices in a power distribution network that can operate with partial data resulting from communications problems. The dynamic graph representation allows the switching devices that isolate faults in the network to automatically obtain the network topology with minimal manual input at device deployment, and enables an automatic topology update in all of the devices when the topology changes. The switching devices in the network are capable of measuring voltage and/or current, and sending that data to other devices or a control center by, for example, wireless transmissions, cellular, fiber optics, etc. In the discussion below, a team is defined as a section of powerlines bounded by switching devices. In the discussion below, the device performing the loading computation is sometimes referred to as the control, where the control may reside in one or multiple switching devices, a substation or control center. There will be data specific for each switching device, such as open/closed status, and data specific for each team, such as amount of load and whether there is a fault within the team. A device list stores device data and a team list stores team data of all of the devices and teams in a certain region of the network. The boundary of this region is specified by the distribution automation scheme.

Figure 1:
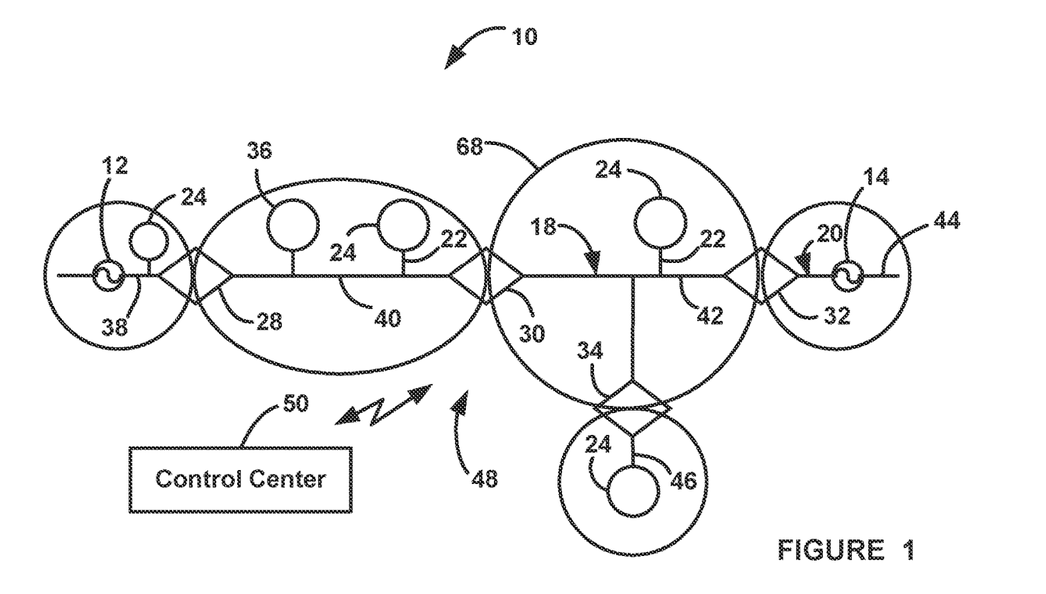
FIG. 1 is a simplified schematic type diagram of an electrical power distribution network.

FIG. 1 is a simplified schematic type diagram of an electrical power distribution network 10 that employs distributed control. The network 10 includes two AC sources 12 and 14, such as electrical substations that step down high voltage power from a high voltage power line (not shown) to medium voltage power. The network 10 also includes switching devices 28, 30, 32 and 34 that can be any suitable device for the purposes discussed herein, such as reclosers, breakers, sectionalizers, etc. The devices 28, 30 and 34 are normally closed devices and the device 32 is a normally open device. This configuration defines a feeder 18 between the source 12 and the devices 32 and 34 and a feeder 20 between the source 14 and the device 32. Lateral lines 22 are coupled to the feeder 18 and feed loads 24. A line section 38 of the feeder 18 is provided between the source 12 and the device 28, a line section 40 of the feeder 18 is provided between the devices 28 and 30, a line section 42 of the feeder 18 is provided between the devices 30, 32 and 34, a line section 44 is connected to the source 14, and a line section 46 is connected to the device 34. The source 12 provides power to the sections 38, 40 and 42 and the source 14 is prevented from proving power to the sections 38, 40 and 42. A distributed generation (DG) source 36, such as solar, wind, turbine, battery, etc., is provided in the section 40.

The combination of the AC source 12, one side of the device 28 and the section 38 define a team, the combination of one side of the devices 28 and 30 and the section 40 define a team, the combination of one side of the devices 30, 32 and 34 and the section 42 define a team, the combination of one side of the device 32, the source 14 and the section 44 define a team, and the combination of one side of the device 34 and the section 46 define a team, where some of the teams define a division 48 and where the devices 32 and 34 are also tie devices between divisions. As will be discussed in detail below, the topology, i.e., device configuration, of the division 48 will be known by all of the devices 28-34 by communications therebetween, where the topology of the division 48 will be automatically revised and updated as devices are removed as added to the network 10. A control center 50 may be in, for example, radio communication with the switching devices 28-34 that provides switching control consistent with the discussion herein.

Figure 2:
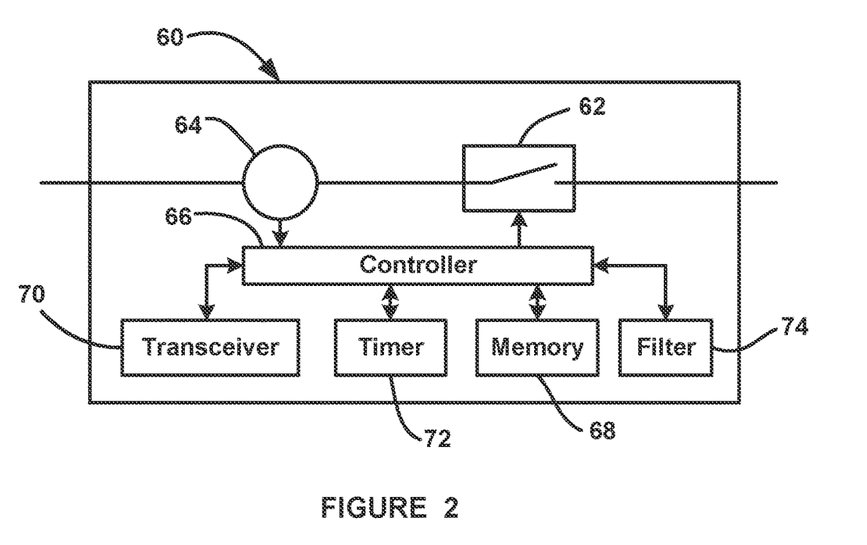
FIG. 2 is a simplified schematic block diagram of a switching device in the network shown in FIG. 1.

FIG. 2 is a simplified schematic block diagram of a switching device 60 intended to be a non-limiting general representation of any one of the switching devices 28-34 in the network 10, where the device 60 may include a switch 62, voltage/current sensors 64, a control device 66 (sometimes referred to herein as the control), a memory 68, having a size of N+1, and a transceiver 70, where the device list and the team list may be stored in the memory 68. Further, for some device designs discussed below, the memory 68 is intended to represent a separate memory on each of the upstream and downstream sides of the device 60. The switching device 60 may also include a timer 72 and a median filter 74 for reasons that will become apparent from the discussion below.

The topology of the power distribution network 10 is represented by specific fields in the device list and the team list, where Tables 1 and 2 below are an example of the device list and the team list, respectively, stored in each of the switching devices 28-34 corresponding to the division 48. The local indices ordering of the devices in the device list and the teams in the team list are different in different devices. The device local index identifies each device in the division 48 separately from the device ID and the team local index identifies the teams in the division 48. The local indices are only meaningful and can identify a device or team in a specific devices memory 68. It is noted that the teams do not need global indexing or IDs, where each team is uniquely identified by the devices on the team. This makes a split or a union of the teams due to the addition or removal of a device easy to accomplish. The device specific data and the team specific data in the lists can be anything relating to that device or team, such a voltage measurements, current measurements, open/closed status, etc. Besides the device specific data, each device in the device list includes two fields, namely, a TeamOnX field that specifies the local index in the team list of the team on each device's X side, and a TeamOnY field that specifies the local index in the team list of the team on each device's Y side, where the X and Y sides of a device are determined by the physical orientation of the device when it is installed. Knowing the orientation of the devices is necessary because these devices are often capable of measuring voltage on both sides of the device. Each team in the team list includes a DevicesOnTeam field that specifies the local indices in the device list (not device ID) of the devices on that team.

TABLE 1

| Local Index | ID | TeamOnX | TeamOnY | Device Specific Data |
|---|---|---|---|---|
| 1 | 28 | A | B | — |
| 2 | 30 | B | C | — |
| 3 | 32 | C | D | — |
| 4 | 34 | C | E | — |

TABLE 2

| Local Index | DevicesOnTeam | Team Specific Data |
|---|---|---|
| A | 1 | — |
| B | 1, 2 | — |

TABLE 2-continued

| Local Index | DevicesOnTeam | Team Specific Data |
|---|---|---|
| C | 2, 3, 4 | — |
| D | 3 | — |
| E | 4 | — |

The TeamOnX field and the TeamOnY field in the device list point to the local indices of the entries in the team list, and the DevicesOnTeam field in the team list points to the local indices of the entries in the device list (not device IDs). This makes it faster to access the information of the devices on a team, and the information of teams on each side of a switching device by eliminating the need for searches. Further, the device local indices in the DevicesOnTeam field are sorted by the device ID. For example, the DevicesOnTeam field for Team C is the switching devices 30, 32 and 34. Because a team is uniquely identified by the devices on the team, this makes the comparison between two teams easier. Specifically, if two teams have the same number of devices, and the devices have the same device IDs pairwise, then they are the same team.

The topology of the division 48 can be recovered from either the device list or the team list, and thus the two lists provide mutual validation. In other words, if the topology recovered from the device list and the topology recovered from the team list are inconsistent, then there is an indication of data errors. Moreover, the two lists also make the traversal of the graph more efficient. For example, if a switching device needs to know which teams are adjacent to Team A, it only needs to read which devices are on Team A in its team list, and which teams are connected to these devices in its device list. By contrast, for the same task, if only the team list contains network topology information, after reading the devices connected to Team A in the team list, the device will need to search through all of the teams to find which team is connected to those devices.

This graph representation makes it possible to automatically discover the network topology by any of the switching devices. Knowing the topology of the network 10 or the division 48 allows power restoration in response to a fault, so that when there is a fault and loads are dropped, knowledge of which loads have been dropped and how big the loads are allows how the open and closed status of the switching devices 28-34 is determined so that alternate sources can be connected to some of the loads.

At deployment of a device, the engineer only needs to manually specify the immediate neighbor devices on each side of the new device and then the topology of the whole division 48 can be provided in all of the devices 28-34 by transferring information and data from device to device. The newly deployed device will automatically build its own device list and team list with this initial information. After sharing this information through automated communications, the control may easily populate the corresponding fields in its device list and team list and have the topology information of the full division 48. For example, in the network 10, if the control is in the switching device 28, then it can start the device list and the team list with the information of its immediate neighbor devices, as shown by Tables 3 and 4 below.

TABLE 3

| Local Index | ID | TeamOnX | TeamOnY | . . . |
|---|---|---|---|---|
| 1 | 28 | A | B | |
| 2 | 30 | B | | |

TABLE 4

| Local Index | DevicesOnTeam | ... |
|---|---|---|
| A | 1 | |
| B | 1, 2 | |

When the switching device 28 receives a message that contains information about the switching device 30 and the immediate neighbor devices of the device 30, it can update its device and team lists, as shown in Tables 5 and 6, respectively, below. It is noted that the local indices in the message can be different than the local indices in the control. Tables 7 and 8 are the updated device and team lists, respectively, in the memory of the device 28 after processing the message.

TABLE 5

| Local Index | ID | TeamOnX | TeamOnY | ... |
|---|---|---|---|---|
| 1 | 30 | A | B | |
| 2 | 28 | | A | |
| 3 | 32 | B | | |
| 4 | 34 | B | | |

TABLE 6

| Local Index | Local Team Indices | ... |
|---|---|---|
| A | 2, 1 | |
| B | 1, 3, 4 | |

TABLE 7

| Local Index | ID | TeamOnX | TeamOnY | ... |
|---|---|---|---|---|
| 1 | 28 | A | B | |
| 2 | 30 | B | C | |
| 3 | 32 | C | | |
| 4 | 34 | C | | |

TABLE 8

| | Local Team Indices | ... |
|---|---|---|
| A | 1 | |
| B | 1, 2 | |
| C | 2, 3, 4 | |

After receiving the information of the device 32 and the device 34 in subsequent messages, the complete device and team lists will be built in the memory 68 of the device 28. One possible reason that the device 28 may not have had the topology information beyond the device 30 is that the system was just initialized. Another possible reason is that the device 30 previously defined the boundary of a division, and because of a change in its status, the two divisions on its two sides are now combined as one division.

For each switching device identified in a message, the recipient device checks if it already has that device in its device list. The same is done for each team. To avoid searches for these checks, the recipient switching device maintains a mapping between the local indices of the device list and the team list in the incoming messages from a specific message source, for example, a switching device, and the local indices of those lists in its own memory. When the recipient device checks whether it already has a device from the message in its own device list, it uses the map to see if this device maps to the same device in its device list. If yes, then the device updates the information in its device list using the message and, if no, then the device updates the mapping before updating its device list. The same procedure applies to the team list. Note that none of the incoming messages needs to convey a full view of the network. As long as the whole network is covered by all incoming messages, the recipient will have up-to-date information of the network. If a message is lost, a device may only have outdated information for the part of the network covered by that message. If the network is designed such that each device calculates its local information, such as team loading, possibly by gathering data from its immediate neighbor devices, and propagates the result out to other devices, then the process requires no central processing.

When a new switching device is added to the network 10, this device only needs to be manually added to its immediate neighbor device's settings as their new neighbor device, and the device lists and team lists of these neighbor devices will update themselves accordingly. As required before, the new device will also only need its own immediate neighbor devices as the manual input in its setting. The data dissemination will then propagate the addition of the device automatically to other devices that need the topology information. Similarly, when a device is removed from the network 10, only its immediate neighbor devices will need to be updated manually, and the updated topology information will propagate automatically to other devices that need the topology information.

The processes described above only adds or updates existing elements (devices and teams) to the lists, and does not remove elements from the lists. Elements do need to be removed from the lists if a device is taken out of the system, or a division is split into two divisions because a device becomes a boundary device. To accomplish the removal of disconnected elements, a graph traversal, such as breadth first search (BFS) or a depth first search (DFS), well known to those skilled in the art, is initiated starting from the device in which the control resides. This graph traversal indicates all the elements that are still within the division 48. Therefore, every element that hasn't been reached by the graph traversal is removed.

As discussed above, in a power distribution network that employs distributed control, knowledge acquired from each of the switching device 28-34 needs to be disseminated through the division 48 so that every device 28-34 in the division 48 has the knowledge, where the division 48 is the basic unit for distribution automation tasks, such as automatic power restoration. For example, to decide what extra network sections each alternative source can power, the automatic power restoration will need the relevant network information, such as power being consumed in each of the sections. Knowledge dissemination can also be used for other purposes, such as supporting voltage regulation decisions.

This disclosure also proposes a knowledge or data dissemination method that enables the switching devices 28-34 to efficiently share their knowledge across the network 10. At the end of each data dissemination period, each of the switching devices 28-34 will have up-to-date knowledge about all of the other devices 28-34 in the division 48. Compared to existing methods, this knowledge dissemination method minimizes the number of messages passed between the devices 28-34 as well as the size of the messages. In particular, topological information is utilized to minimize not just the number of messages, but also the number of hops between the devices 28-34 each message needs to make.

The proposed knowledge dissemination method propagates data from one device to another device in a distributed fashion. As a manual input in the device settings, each device knows its immediate neighbor devices on each side. An endpoint device is defined as a device that does not have an immediate neighboring device on one of its two sides or a device that defines the boundary of the division that the distribution automation system considers, such as open tie devices. For example, in the network 10, the devices 28, 32 and 34 are all endpoint devices, where the boundaries of the division 48 are defined by open tie devices, which are the normally open devices 32 and 34. The devices 28 and 30 are closed.

In the proposed dissemination method, the endpoint devices 28, 32 and 34 will periodically initiate data dissemination into the division 48 as triggered by the timer 72, such as every five seconds. When the timer 72 in each of the endpoint devices 28, 32 and 34 expires, the endpoint devices 28, 32 and 34 will reset their timer 72 to expire in the same amount of time, and send a data dissemination message including information and data it has stored about itself, such as voltages, currents, loads on sections, open/close status, etc., to their one-side neighbor devices. For example, in the network 10, when the timer 72 expires, the device 28 will reset its timer and send a data dissemination message to the device 30 containing its up-to-date information, the device 32 will reset its timer and send a data dissemination message to the devices 30 and 34 containing its up-to-date information, and the device 34 will reset its timer and send a data dissemination message to the devices 30 and 32 containing its up-to-date information. Note that it is beneficial if the timers are GPS synchronized, but it is not a requirement as discussed below. It is also noted that the communications of messages from one device to a next device as described herein may reference a flow direction of the messages.

As soon as a non-endpoint device receives messages from all of its neighbor devices on its message receiving side, it will send a message to all of its neighbor devices on its message sending side along the flow direction, where the flow direction can be in either direction. This message will contain the information about the device itself, as well as the information it has about every other device on its message receiving side. This includes the information from its immediate neighbor devices on the message receiving side and all of the devices beyond the immediate neighbor devices. For example, in the network 10, after the device 30 receives the message from the device 28, it will store the information and send a data dissemination message to the devices 32 and 34 containing the information about itself, as well as the information about the device 28. Similarly, after the device 30 receives the messages from the devices 32 and 34, it will store the information and send a data dissemination message to the device 28 containing the information about itself, as well as the information about the devices 32 and 34. The non-endpoint devices know what devices are on each of their sides in the division 48, and will not to send its message until it receives the information from all of the devices on a particular side. When a division boundary or endpoint device receives messages from all of its neighbor devices on one side, it will not send a message to all of its neighbor devices on the other side because the neighbor devices on the other side are in a different division. By this process, at the end of each data dissemination period, each device will have the information of all of the devices in the division 48.

Figure 3:
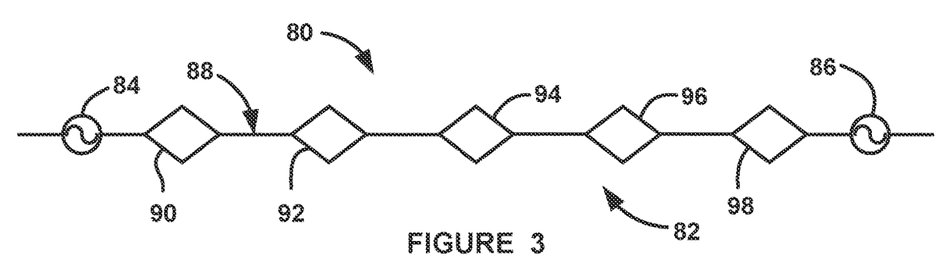
FIG. 3 is a simplified schematic type diagram of an electrical power distribution network illustrating an extreme linear case for a data dissemination process.

FIG. 3 is a simplified schematic type diagram of an electrical power distribution network 80 illustrating an extreme linear case for the data dissemination process as discussed above. The network 80 includes an AC power sources 84 and 86 and, in order from the source 84 to the source 86, switching devices 90, 92, 94, 96 and 98, where the switching devices 90 and 98 are endpoint devices and the switching device 98 is normally open. In this configuration, a division 82 is provided between the source 84 and the device 98 and includes a feeder 88. When its timer expires, the switching device 90 sends its information to the switching device 92. When the switching device 92 receives the information from the switching device 90 it sends its information and the information about the switching device 90 to the switching device 94. When the switching device 94 receives the information from the switching device 92 it sends its information and the information about the switching devices 90 and 92 to the switching device 96. When the switching device 96 receives the information from the switching device 94 it sends its information and the information about the switching devices 90, 92 and 94 to the switching device 98. Likewise, when its timer expires, the switching device 98 sends its information to the switching device 96. When the switching device 96 receives the information from the switching device 98 it sends its information and the information about the switching device 98 to the switching device 94. When the switching device 94 receives the information from the switching device 96 it sends its information and the information about the switching devices 96 and 98 to the switching device 92. When the switching device 92 receives the information from the switching device 94 it sends its information and the information about the switching devices 94, 96 and 98 to the switching device 90.

Figure 4:
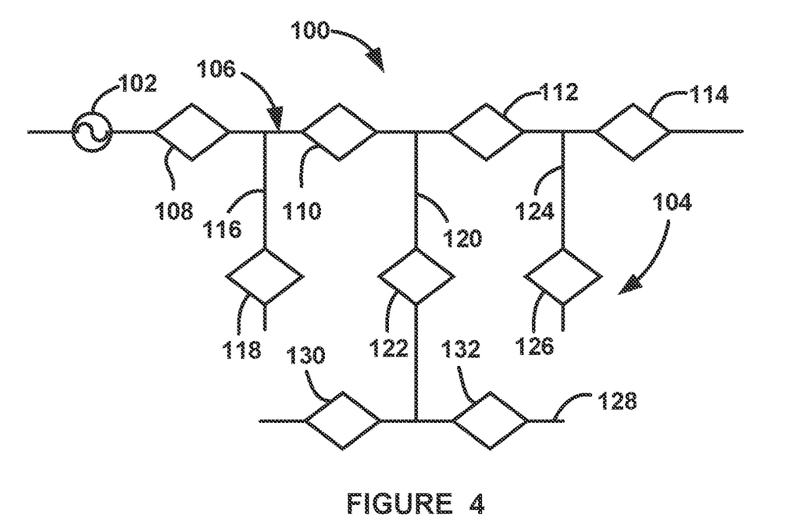
FIG. 4 is a simplified schematic type diagram of an electrical power distribution network illustrating another extreme case for a data dissemination process.

FIG. 4 is a simplified schematic type diagram of an electrical power distribution network 100 illustrating another extreme case for the data dissemination process as discussed above. The network 100 includes an AC power source 102 and a division 104. The division 104 includes a feeder 106 coupled to the power source 102, switching devices 108, 110, 112, 114, 118, 122, 126, 130 and 132 coupled along the feeder 106, as shown, where the switching devices 108, 114, 118, 126, 128 and 130 are endpoint devices of the division 104. As above, along one flow direction, the switching device 110 does not send its data dissemination message to the right until it receives the messages from the switching devices 108 and 118, the switching device 122 does not send its data dissemination message until it receivers the messages from the switching devices 130 and 132, the switching device 112 does not send its data dissemination message to the devices 110 and 112 until it receives the messages from the switching devices 110 and 122. Likewise, along another flow direction, the switching device 112 does not send its data dissemination message to the left until it receives the messages from the switching devices 114 and 126, the switching device 122 does not send its data dissemination message to the switching devices 110 and 112 until it receives the message from the switching devices 130 and 132, and the switching device 110 does not send its data dissemination message to the left until it receives the messages from the switching devices 112 and 122 that include information from all of the switching devices 112, 114, 122, 126, 130 and 132.

A self-tie is a series of two or more switching devices where every device is both different from and a neighbor device of the device preceding it, none of the devices in the series is an endpoint device, and the same devices are listed both at the beginning and the end of the series. If there is a self-tie in the division, and no device in the self-tie is a division boundary device, then one device in the self-tie will be designated as an endpoint device by a predefined rule as explained below in paragraph [0046]. This prevents the data dissemination from entering an endless loop.

The discussion below is a comparison between the proposed data dissemination method and two other known data dissemination solutions, namely, a naïve solution and a centralized solution. In the naïve solution, each switching device sends a message with its own information to every other device. In the centralized solution, one of the devices in a division is designated as a concatenator device. Each switching device in the division will send a message to the concatenator device with its own information. After receiving messages from every device in the division, the concatenator device will send a message with the information of the whole division to its neighbor devices, which will then forward it to their neighbor devices and so forth. It is noted that due to geographical restrictions, when a switching device sends a message to another device, the message may need to be routed through multiple devices. To simplify the comparison, it is assumed that each device can only send direct messages to its immediate neighbor devices. Therefore, in order to send a message to another device that is not a neighbor device, the message will be routed through a neighbor device and the neighbor device's neighbor device until the destination using the shortest path according to the network topology. For example, in the network 10, when the device 28 needs to send a message to the device 32, the device 28 will send the message to the device 30, and then the device 30 will send it to the device 32. To measure the message size, a unit of data is defined as the data containing the voltage and current measures of one device.

Examples can be produced that show that the data dissemination method proposed in this disclosure requires a relatively small number of messages compared to other methods, such as naïve and centralized methods, while the messages are still of a reasonable size. It is also noted that the average units of data each device sends (average number of messages×average message size) is the minimum for the proposed approach compared to other methods, such as naïve and centralized methods. This has a direct impact on the time it takes for each device to get the full picture of the division 48. These advantages of the proposed method are found in other types of network topologies as well, from linear structures, such as the network 80, to full tree structures, such as the network 100.

It is noted that for the centralized solution, the number of messages depends on the choice of the concatenator device. Finding a concatenator device that minimizes the number of messages in a complex network is not trivial. Even if such a concatenator device can be found, it may not result in fewer messages than the proposed method, and it may still result in more data being passed around than the proposed method. The main disadvantage of the centralized solution is that if the concatenator device of a division experiences any malfunction, no data will be passed. Furthermore, if any communications link is down, then the devices downstream of the communications link in relation to the concatenator device will not receive any data about their neighbor devices who are also downstream of this communications link.

For the proposed data dissemination method, it is beneficial to maintain the information dissemination process relatively synchronized between the devices. Specifically, the more synchronized the process is the newer the information a device will have about other devices. For a switching device that has multiple neighbor devices on the receiving side and at least one neighbor device on the sending side if it receives messages from all of the neighbor devices on the receiving side around the same time, then it can immediately send a message to the neighbor devices on the sending side. By contrast, if it receives messages from its receiving side neighbor devices one after another during a longer time span, then it has to wait for a longer time to send a message to its sending side neighbor devices, because it will only send the message after it receives the message from the last receiving side neighbor device. This results in the information that a device has about the distant devices to be relatively old.

If the devices have reliable synchronized clocks, it is straightforward to synchronize the information dissemination between the devices. In this disclosure, an alternative method of roughly synchronizing the information dissemination through messaging for the cases where reliable synchronized clocks are not available is also proposed. To do this, one of the switching devices 28-34 in the division 48 is designated as the synchronizer device, where the synchronizer device periodically sends out sync messages to its neighbor devices. When a device receives a sync message from one side, it will propagate this message to all of the neighbor devices on the other side. When an endpoint device receives a sync message, it will reset its timer for data dissemination. If an endpoint device is selected as the synchronizer device, then it will reset its timer for data dissemination as soon as it initiates the sync messages. The synchronizer device sends the sync messages at a much lower frequency than the information dissemination messages. For example, the synchronizer device may initiate a sync message every five minutes, and the endpoint devices may initiate regular information dissemination messages every five seconds. Note that this method does not require the synchronizer device to have a complete view of the division, where each device in the division only needs to know its own neighbor devices on each side. Also note that this method can be used to initiate data dissemination. Since the sync messages are propagated out from the synchronizer device, for different possible locations of the synchronizer device in a division, the total number of sync messages for the division 48 will be the same.

If the synchronizer device of a division experiences any malfunction, the information dissemination may not be synchronized. However, unlike the concatenator device in the centralized dissemination method, in this case, the information dissemination will continue. The switching devices will still have updated information of all of the other devices, albeit with longer delay. To regain synchronism after a division loses its synchronizer device, a non-synchronizer device that does not receive a sync message for more than 1.5 times of the regular time interval for sync messages, will start sending out sync messages to its neighbor devices. While this may result in multiple devices thinking themselves as the synchronizer device of the division, this can be resolved as explained below.

In the case where more than one device thinks it is the synchronizer device of the division, they will all initiate sync messages. If a device receives a sync message initiated from a different synchronizer device than the synchronizer device in its memory, it will determine if the new synchronizer device is more qualified as a synchronizer device than the old device based on predefined rules, such as the one with the highest ID. If yes, it will update its own memory of the new synchronizer device. If not, it will ignore this sync message and not propagate it to other devices. Because this qualification process happens in all devices including those who think themselves to be the synchronizer device of the division 48 at the end of this process, only the most qualified device will remain the synchronizer device of the division 48.

To deal with possible self-ties that do not include a boundary device in the division, as mentioned earlier in paragraph [0038], a device in the self-tie is designated as an endpoint device. This can be done by exploiting the sync messages. Specifically, if a device receives a sync message from one side and later receives a sync message from the other side, both sync messages are initiated by the same synchronizer device, and the sync messages were originally sent from the same side of that synchronizer device, then this device is designated as a virtual endpoint device, and it does not propagate the second sync message. This is necessary because if the sync messages were originally sent from the different sides of that synchronizer device, it means that the synchronizer device itself is in the self-tie, and it is an endpoint device itself, so there is no need to create a virtual endpoint device.

With distributed data dissemination methods as discussed herein, the data messages are usually propagated from one device to another device following certain flow paths, where the goal is for each device to have the full and current information of all of the other devices at the end of each dissemination process, and where a flow path can either be a linear path or a more complex graph structure with branching and joining lines. Any local interruption to the flow of messages, either momentary or permanent, may block the regular flow of the data dissemination. Specifically, any momentary or intermittent interruption of the communications may prevent a device from obtaining updated information about another device for an extended period of time. And, if the communications problem is permanent, then a device may never get any information about another device.

With any communications problem, some degradation in performance is inevitable. The purpose of the communications error handling is to minimize the impact of communications problems so that each device can still have some information about the other devices. Although this information may be incomplete and relatively outdated, it is better than not having any information. In contrast, existing distributed data dissemination methods that rely on or assume perfect communications will completely stop data dissemination while communications problems exist, even if the problems are intermittent or restricted to only a few devices.

This disclosure proposes two communications error handling methods, where one method deals with short-term contingencies and the other method deals with long-term contingencies. When the communications problem appears temporary, the logic for short-term contingencies will maintain the flow of data dissemination despite the problem. When the communications problem appears permanent, the logic for long-term contingencies will reroute the data dissemination to circumvent the problem.

The following discussion illustrates the benefits of applying the proposed communications error handling methods and not applying them. For a one message loss error, the outcome without the proposed error handling is that all of the feeder data is two data dissemination periods old and the outcome with the proposed error handling is that the feeder data is still one data dissemination period old for adjacent sections and two data dissemination periods old for other sections, where when a fault occurs and the sections downstream of the fault need to be restored, information for sections farther away upstream of the fault is not needed. For intermittent message losses for several dissemination periods, the outcome without error handling is the newest feeder data would be the data collected before the first message loss, and the outcome with error handling is the feeder data is gradually older for devices farther away on the feeder. For permanent communications loss of a device, where devices on both sides of that device experiencing communications loss can still communicate with each other, the outcome without error handling is the newest feeder data would be the data collected before the communications loss and fault restoration performed on old loading data can lead to sub-optimal results, and the outcome with error handling is the feeder data is up to date except for the loading distribution between the sections on the two sides of the problematic device and fault restoration will be optimal as the device experiencing communications loss cannot be commanded to operate anyway.

The network 80 shown in FIG. 3 can be used to describe the proposed error handling scheme when communications losses occur. As discussed, each endpoint switching device 90 and 98 periodically sends messages to its immediate neighbor switching devices 92 and 96. The non-endpoint switching device 92, 94 and 96 wait until they receive messages from all of their neighbor devices on one side, and then send the aggregated information in a message to all of the neighbor devices on the other side. For example, every t seconds, i.e., the data dissemination interval, the device 90 sends a message containing its own data to the device 92. When the device 92 receives the message from the device 90, the device 92 will send a message to the device 94 with the data from the devices 90 and 92, and so on down the feeder 88. When the device 98 receives a message from the device 96, the device 98 will just store other devices' data from the message in its own memory. Similarly, another message will flow down the feeder 88 in the opposite direction from the device 98 to the device 90. After both message flows are finished, all of the devices 90-98 will have the complete and updated information of all of the other devices.

For the explanation of the proposed communications error handling methods, only the data dissemination flow from the device 90 to the device 98 will be described. In this explanation, the device 90 is the initiator device because it initiates the data dissemination flow, the device 98 is the terminator device because the dissemination flow stops at the device 98, and the other devices 92-96 are intermediate devices. For this flow, a from-neighbor device of a device is a neighbor device that this device receives messages from, and a to-neighbor device is a neighbor device that the device sends messages to. Note that these definitions are specific to the particular message flow being discussed, and are only introduced for the discussion below. The devices 90-98 themselves do not make these designations as each side of a device is treated exactly the same, and independently of the other side of the device. In other words, when a device disseminates aggregated device information to one side after receiving all of the messages from the other side, it does so regardless of how many messages it already received from the other side. The only requirement for this scheme to work is that all of the endpoint devices send messages to their neighbor devices every data dissemination interval.

To handle short-term communications contingencies, the intermediate devices 92-96 will use two timers. Whenever an intermediate device sends a message to to-neighbor devices because it received message(s) from from-neighbor devices, it will set its timer to expire in the time defined as a backup interval, where it is required that a data dissemination interval is less than the backup interval, which is less than two times the data dissemination interval. The timer will be reset each time the device sends a message. With this condition, when communications are working properly, the timers in the intermediate devices 92-96 will always be reset before expiring. However, when a message is lost during transmission, the timer in an intermediate device may expire. When the timer expires, this device will send a message to the next device(s) along the flow direction even though it did not receive a message from each of the preceding device(s) or from-neighbor devices. It will then set its timer to expire in the time of the data dissemination interval. For example, if the message sent from the device 92 to the device 94 is lost, the timer in the device 94 will expire, and it will send a message to the device 96 although it did not receive a message from the device 92. This message will contain the updated information of the device 94, but the older information from the devices 90 and 92. In this case, the device 94 is effectively a new initiator device for this round of data dissemination for this direction of message flow. This results in the device 98 having the updated information of the devices 94 and 96, but the older information of the devices 90 and 92. Had the backup interval mechanism not been implemented, the device 98 would not have updated information of any of the other devices.

This short-term contingency handling logic is especially useful for intermittent down communications links. Assume that the communications link between the devices 92 and 94 and the communications link between the devices 94 and 96 are not stable, where the messages sent from the device 92 to the device 94 and the messages sent from the device 94 to the device 96 get lost about 50% of the time. In this particular example, one of these two communications links is always down in any round of the data dissemination flow. Then, as illustrated below in Tables 9-13, after several rounds of data dissemination, the device 98 will have relatively up-to-date information about the other devices 90-96. The number in each box in the Tables 9-13 indicates how current the particular device stored data is relative to a certain round of data dissemination. For example, the memory in the device 98 holding the information of the device 90 with number 2 means the device 98 has the information of the device 90 from data dissemination round 2. Table 9 is the stored data in each device 90-98 after data dissemination round 0, i.e., perfect communication, Table 10 is the stored data in each device 90-98 after data dissemination round 1, i.e., the communications link between the devices 92 and 94 is down, Table 11 is the stored data in each device 90-98 after data dissemination round 2, i.e., the communications link between the devices 94 and 96 is down, Table 12 is the stored data in each device 90-98 after data dissemination round 3, i.e., the communications link between the devices 92 and 94 is down, and Table 13 is the stored data in each device 90-98 after data dissemination round 4, i.e., the communications link between the devices 94 and 96 is down. If the short-term contingency handling logic was not used in this example, then the device 98 would never have any updated information about any of the other devices.

TABLE 9

|  | 90's memory | 92's memory | 94's memory | 96's memory | 98's memory |
|---|---|---|---|---|---|
| 90's information | 0 | 0 | 0 | 0 | 0 |
| 92's information |  | 0 | 0 | 0 | 0 |
| 94's information |  |  | 0 | 0 | 0 |
| 96's information |  |  |  | 0 | 0 |
| 98's information |  |  |  |  | 0 |

TABLE 10

|  | 90's memory | 92's memory | 94's memory | 96's memory | 98's memory |
|---|---|---|---|---|---|
| 90's information | 1 | 1 | 0 | 0 | 0 |
| 92's information |  | 1 | 0 | 0 | 0 |
| 94's information |  |  | 1 | 1 | 1 |
| 96's information |  |  |  | 1 | 1 |
| 98's information |  |  |  |  | 1 |

TABLE 11

|  | 90's memory | 92's memory | 94's memory | 96's memory | 98's memory |
|---|---|---|---|---|---|
| 90's information | 2 | 2 | 2 | 0 | 0 |
| 92's information |  | 2 | 2 | 0 | 0 |
| 94's information |  |  | 2 | 1 | 1 |
| 96's information |  |  |  | 1 | 2 |
| 98's information |  |  |  |  | 2 |

TABLE 12

|  | 90's memory | 92's memory | 94's memory | 96's memory | 98's memory |
|---|---|---|---|---|---|
| 90's information | 3 | 3 | 2 | 2 | 2 |
| 92's information |  | 3 | 2 | 2 | 2 |
| 94's information |  |  | 3 | 3 | 3 |
| 96's information |  |  |  | 3 | 3 |
| 98's information |  |  |  |  | 3 |

TABLE 13

|  | 90's memory | 92's memory | 94's memory | 96's memory | 98's memory |
|---|---|---|---|---|---|
| 90's information | 4 | 4 | 4 | 2 | 2 |
| 92's information |  | 4 | 4 | 2 | 2 |
| 94's information |  |  | 4 | 3 | 3 |
| 96's information |  |  |  | 4 | 4 |
| 98's information |  |  |  |  | 4 |

For the long-term contingency handling, it is assumed that the communications layer in each switching device 90-98 can identify the states of communications links between that device and the other devices and store them in a communications connectivity table, i.e., whether each device can receive messages from and transmit messages to the other devices. There are two flow directions and three possible states for each communications link. For a certain device, its communications layer identifies the other devices it can transmit messages to and the other devices it can receive messages from. The possible states for each direction of a communications link are Yes (✓), No (x) and Unknown (?). The long-term contingency handling logic only takes effect when the communications layer decides that some of the communications links are not in the Yes state. It is noted that if the device 90 can receive messages from the device 92, then when the device 92 sends a message to the device 90, the communications layer can find a route for the message. This route could be one message directly from the device 92 to the device 90, or multiple messages routed from the device 92 to the device 90 through other devices using an existing routing protocol provided by the communications layer. As such, if the device 90 cannot receive messages from the device 92, then there is no possible route for any message from the device 92 to the device 90.

The following are two examples of how such connectivity tables can be used. In the first example, the device 92 cannot send or receive messages, where the corresponding connectivity Tables 14-16 of the device 90, the device 92 and the device 94, respectively, are shown below. From these tables, the device 90 and the device 94 can communicate with each other despite the device 92 being down. This may be because the device 90 and the device 94 are within each other's transmission range because there is a repeater between them or because there are other nearby devices on other feeders that can help route the messages between them.

TABLE 14

| 90 | 92 | 94 | 96 | 98 |
|---|---|---|---|---|
| Transmit-to | ? | ✓ | ✓ | ✓ |
| Receive-from | x | ✓ | ✓ | ✓ |

TABLE 15

| 92 | 90 | 94 | 96 | 98 |
|---|---|---|---|---|
| Transmit-to | ? | ? | ? | ? |
| Receive-from | x | x | x | x |

TABLE 16

| 94 | 90 | 92 | 96 | 98 |
|---|---|---|---|---|
| Transmit-to | ✓ | ? | ✓ | ✓ |
| Receive-from | ✓ | x | ✓ | ✓ |

In the second example, assume that one direction of a communications link is down, for example, caused by vegetation, resulting in the devices 90-98 breaking into two communications groups, where a communications group is a subset of the devices such that any two devices within this group can communicate with each other with two-way communications. In this example, the devices 90 and 92 in Group 1 can only send messages to, but not receive messages from the devices 94-98 in Group 2. The corresponding connectivity Tables 17-19 of the devices 90-94, respectively, are shown below.

TABLE 17

| 90 | 92 | 94 | 96 | 98 |
|---|---|---|---|---|
| Transmit-to | ✓ | ? | ? | ? |
| Receive-from | ✓ | x | x | x |

TABLE 18

| 92 | 90 | 94 | 96 | 98 |
|---|---|---|---|---|
| Transmit-to | ✓ | ? | ? | ? |
| Receive-from | ✓ | x | x | x |

TABLE 19

| 94 | 90 | 92 | 96 | 98 |
|---|---|---|---|---|
| Transmit-to | x | x | ✓ | ✓ |
| Receive-from | ✓ | ✓ | ✓ | ✓ |

When the communications layer of a device detects that in its communications connectivity table, the entry for a from-neighbor device does not have Yes for both directions, it will perform a graph search, such as a BFS or DFS, on the from-side of the device to find the closest devices in the topology that have Yes for both directions, and assign them as the new from-neighbor devices. It is assumed that when the network is initially brought up online, or when devices are installed or removed, there is some time interval in which all of the devices communicate with each other properly so they all have built an up-to-date topological view of their surroundings. For example, in connectivity Table 16, when the communications are perfect, the old from-neighbor device of the device 94 is the device 92. Since in the connectivity Table 16 for the device 94, the device 92 no longer has Yes for both directions, the device 94 will find the closest device on the from-side in its topology with Yes for both directions for its new from-neighbor device, where the new from-neighbor device is the device 90.

In the connectivity Table 19 for the device 94, the device 92 is no longer a from-neighbor device, and there is no qualified device as a from-neighbor device for the device 94. Without a from-neighbor device, the device 94 becomes an initiator for the flow. Note that for the device 94, even though the device 92 is not a from-neighbor device anymore because the device 94 cannot transmit messages to the device 92, it is still possible that the device 94 can receive messages from the device 92. If a device receives a message from a known device that is not a from-neighbor device, it will process and integrate the data in the message, but will not trigger the sending of a message to its to-neighbor devices.

Similarly, when the communications layer of a device detects that in its connectivity table, a to-neighbor device does not have Yes for both directions, it will perform a graph search on its to-side to find the closest devices in the topology that have Yes for both directions, and assign them as the new to-neighbor devices. In addition, it will also add the devices between itself and the new to-neighbor devices for up to L levels in topology as additional to-neighbor devices (L≥1), where L can be a user defined number such as 2. From those additional to-neighbor devices, those who have a No for the transmit-to direction will be excluded. For example, in the communications connectivity Table 14 for the device 90, the device 94 becomes a new to-neighbor device and, for L=2, the device 92 is also a to-neighbor device since the device 90 is uncertain about whether the device 92 can receive messages from it. In the connectivity Table 18 for the device 92, there is no device with two-way communications on the to-side and, for L=2, the devices 94 and 96 will be added as the new to-neighbor devices, which results in the split of the flow for data dissemination. For Group 1, whenever the timer 72 for the left-right direction of message flow in the device 90 expires, it sends a message to the device 92, and the device 92 sends messages to the devices 94 and 96. For Group 2, whenever the timer in the device 94 expires, it sends a message to the device 96, and the device 96 sends a message to the device 98. Note that the devices 94 and 96 will receive messages from the device 92, but they will only process and integrate the data in the messages. The flow of the data dissemination in Group 2 is still controlled by the timer in the device 94. The end result is that the device 98 will have the information of all of the other devices 90-96. But, for another data dissemination flow from the device 98 to the device 90, the unidirectional down communications link makes it impossible for the device 90 to get updated information of the devices 94-98 in Group 2.

In distribution automation power networks of the type being discussed herein, it is important for the control devices to have updated load information for each section in the network so as to know what loads can be powered by what sources so that the sources are not overloaded when load switching occurs in response to faults, where a section's boundary is defined by switching devices or other current measuring devices. The load of each section can either be computed by actual current and voltage measurements of the switching devices on the boundary or by actual current and estimated voltage measurements of those devices. However, it is difficult to always get accurate and locally synchronized measurements for the load computation. The purpose for computing updated loading information is to enable automatic restoration from faults, or automatic reconfiguring of the electric network for optimal load balancing. Specifically, to decide what extra network sections each alternative source can power, the power being consumed in each section must be known.

This disclosure also proposes a robust statistical method to compute load power that smooths out unstable measurements, which improves the existing methods of computing loads in many aspects. In this disclosure, loads are considered at the section level. As referred to above, each section is defined as the powerlines bounded by the switching devices, or other devices capable of measuring current magnitude. This proposal works the best for devices that are also capable of measuring voltages, but this is not required. In closed loop topologies where two or more power sources are allowed to be combined to power the same loads, the direction of the current flow with respect to voltage is assumed to be measurable by the use of phasor voltage and current measurements, remote synchro-phasor voltage measurements combined with local synchro-phasor current measurements, or other means. Using the method in this disclosure, if the measurements are in the phasor domain, i.e., complex values, the resulting power will be complex power. In radial topologies, if only current magnitude measurements are available, the method can still be applied, although the results will only be power magnitudes. The control is assumed to have the network topology information because the load of each section is computed from the devices around the section.

This loading estimation scheme must be accompanied by a communications scheme in which each device's latest voltage and current measurements are periodically sent to the control, either directly or indirectly depending on the data dissemination scheme. The control then computes the updated load for each section. Alternatively, where there are multiple controls distributed throughout the network, the computation of the load can be distributed such that a control at each section computes the load for that section, and communicates the result to controls in other sections. Measurements of different devices may arrive at the control at different times. At the end of each data dissemination period, the control should have received the latest measurements from all of the devices. Such measurements can be the complex power flowing through each device. If the phasors, i.e., complex voltages and currents, are periodically sent to the control for other purposes, then there is no need to send complex powers in addition to the phasors because the complex powers can be computed from the phasors.

The loads for the sections are computed from measured or derived power measurements, i.e., using the measured or estimated voltages and measured currents. The load of a section s for each phase p, where p can be phase A, B or C, is the sum of the power flowing into the section from all of the devices around the section, i.e., net power flow, on the phase p. Assume that for a device k bounding a section s for phase p, the measured current is $I_{k,p}$, the measured voltage, if available, is $V_{k,p}$, and if the device lacks a voltage sensor, the estimated voltage is $V_{e,k,p}$, where $V_{k,p}$, $V_{e,k,p}$ and $I_{k,p}$ can be phasor values or just magnitudes depending on the measuring capability. Where applicable, $ctp_{k,s}$ stands for the current transformer polarity, where $ctp_{k,s}=1$ if current flowing through the device k into section s is measured as positive current, and $ctp_{k,s}=-1$ otherwise. Table 20 below shows how the power flowing through the device k into the section s on phase p, denoted as $P_{k,s,p}$, is computed.

TABLE 20

| Device's measure capability | Power Calculation |
| --- | --- |
| Measured voltage phasor $V_{k,p}$ and current phasor $I_{k,p}$ | $P_{k,s,p} = ctp_{k,s} \times V_{k,p} \times I^*_{k,p}$ |
| Estimated voltage synchrophasor $V_{e,k,p}$ and current synchorophasor $I_{k,p}$ | $P_{k,s,p} = ctp_{k,s} \times V_{e,k,p} \times I^*_{k,p}$ |
| Voltage magnitude $V_{k,p}$ and current magnitude $I_{k,p}$ with some measure of directionality, for example, by measuring the time difference between the voltage's zero crossing and the current's zero crossing; | $P_{k,s,p} = ctp_{k,s} \times V_{k,p} \times I_{k,p} \times dir(I_{k,p})$ |

TABLE 20-continued

| Device's measure capability | Power Calculation |
|---|---|
| specifically, $\text{dir}(I_{k,p}) = 1$ if current angle is close to voltage angle, or $\text{dir}(I_{k,p}) = -1$, if current angle is about 180° off of voltage angle | |
| Voltage magnitude $V_{k,p}$ and current magnitude $I_{k,p}$, in a radial topology where $\text{dir}_{k,s} = -1$ if segment s is between device k and the source, as determined by topology, and $\text{dir}_{k,s} = 1$ otherwise | $P_{k,s,p} = V_{k,p} \times I_{k,p} \times \text{dir}_{k,s}$ |
| Estimated voltage magnitude $V_{e,k,p}$ and current magnitude $I_{k,p}$ in a radial topology where $\text{dir}_{k,s}$ is defined as above | $P_{k,s,p} = V_{e,k,p} \times I_{k,p} \times \text{dir}_{k,s}$ |

If the device k is not equipped with a voltage sensor, the voltage at the device k, as a phasor or just magnitude, must be estimated from the measurement(s) of nearby device(s). For example, the voltage of the nearest voltage-measuring device can be used, or an average voltage can be computed from several nearby voltage-measuring devices. In non-radial networks, if some switching devices are not equipped with a voltage sensor, all voltage and current measurements need to be phasors, and these phasor measurements need to be synchronized (synchro-phasors). In radial networks, nominal voltage can be used as well, where no actual voltage sensing is required. If a step-down or step-up transformer exists between the device k and the voltage-measuring device, then the voltage needs to be adjusted based on the transformer.

With the power of each switching device around the section s, the load of this section on phase p is then $L_{s,p} = \Sigma_{k \in K_s} P_{k,s,p}$, where $K_s$ is the set of all of the devices around this section. If phasors are used in the computation, then the load is a sum of complex values and is itself a complex value.

If there is load in a section having a constant-voltage source, i.e., substation, and the control has no access to the measurements on the source side of the section, then the load cannot be calculated with the above described method. For example, in the section 38 of the network 10, when computing the available additional power capacity the source 12 can provide, which may be necessary to determine whether the source 12 can provide power to additional sections for switching calculations during a fault event so that the source 12 is not overloaded, a conservative estimate can be used. More particularly, if the maximum power that the source 12 can provide is $P_{source}$, the maximum load allowed on the section 38 is $L_{max}$, and the load 24 on the section 38 computed using the method above from measurements from the switching device 28 is $L_1$, which should be negative since power is flowing out of the section 38, then the available additional capacity $P_{addition}$ that the source 12 can provide is $P_{addition} = P_{source} - L_{max} + L_1$.

If there is a DG source, such as a solar, wind, turbine, battery, etc., with constant power in a section, it will be treated as a negative load, where it would not be known how much power the source can provide or is providing. In this case, the load calculation using the measurements from other devices around this section will be the same as described above. For example, if the DG source 36 in the section 40 is outputting more power than the customers of the section 40 are consuming, i.e., the load 24, then the load of the section 40 will be negative using the computation described above. In other words, the load of the section 40 that is computed using the computation described above is the sum of the power output of the DG 36 and the power consumption of the load 24.

The control maintains a memory, for example, the memory 68, for each device on each side to store the recent history of the measurements. The memory 68 is used for the improvement of robustness and the handling of unidentified transient behaviors due to faults, switching, etc. The size of the memory 68 for each side of each device is fixed. Whenever a new measurement is received, it will be stored in the corresponding memory, and the oldest value of that measurement in the memory 68 is erased.

To handle transient behaviors due to faults, switching, etc. and smooth out unstable measurements, instead of computing the section load from the latest measurements, the median filter 74 using N recent measurements is applied for the load computation. Specifically, for the devices around a section, with the recent history of the measurements in the memory 68, Load #1 is computed from the latest measurements of each device, Load #2 is computed from the second latest measurements of each device, . . . , and Load #N is computed from the Nth latest measurements of each device. Then, the median of Load #1, Load #2, . . . , Load #N is taken, and this median value is used as the load for that section.

The reason that a median filter is chosen over other possible filters is that a median filter can handle up to $(N-1)/2$ outliers with N samples. In other words, if up to $(N-1)/2$ samples are affected by arbitrarily large errors, the median estimate will still be based on one of the correct remaining samples. In contrast, by that definition, an average filter cannot properly handle even a single outlier. Another feature of a median filter is that for most of them, the filtered result matches one of the sampled values.

There are different types of median filters suitable for loading computations with two-dimensional sample points. This is the case when the power is represented as a complex value, one dimension being the real part (active power) and the other dimension being the imaginary part (reactive power). One example is described below of such a median filter for complex power. For N complex numbers $c_1, c_2, \ldots, c_N$, the median of the real part $M_{Re} = \text{median}_{n=1,\ldots,N}\{\text{Real}(c_n)\}$ and the median of the imaginary part $M_{Im} = \text{median}_{n=1,\ldots,N}\{\text{Imaginary}(c_n)\}$ are computed. These parts are then combined as the reference point $M_{Ref} = M_{Re} + iM_{Im}$. Note that $M_{Ref}$ may not belong to the set of the sample points. Finally, a complex number is chosen in the samples that is the closest to the reference point $M_{Ref}$ as the median of the samples, i. e., $M = \text{argmin}_{cn=c1,c2,\ldots,cN}\{|c_n - M_{Ref}|\}$. Another possible alternative median filter to the above one is the geometric median. In general, geometric medians are computationally more intensive.

Figure 5:
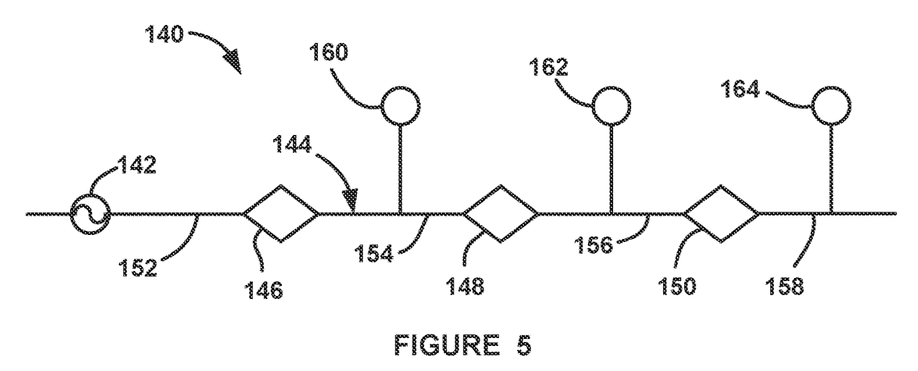
FIG. 5 is a simplified schematic type diagram of an electrical power distribution network for describing load calculations.

The following is an example illustrating the issues with computing loads in sections using only the latest measurements, but not using the measurement stored in the memory 68 and the median filter 74. FIG. 5 is a simplified illustration of an electrical power distribution network 140 including an AC source 142, a feeder 144 coupled thereto, and switching devices 146, 148 and 150 coupled to the feeder 144, where a source section 152 is defined between the source 142 and the device 146, a load section 154 is defined between the devices 146 and 148, a load section 156 is defined between the devices 148 and 150 and a load section 158 is defined downstream of the device 150, and where the section 154 has a load of 160, the section 156 has a load of 162 and the section 158 has a load of 164, where the load 160 is 50 kW, the load 162 is 20 Kw and the load 164 is 40 kW.

At a first step, the device 146 takes load measurements, calculates the power flowing through the device 146, which is 110 kW in this example because of the total load downstream of the device 146, and sends the power calculation to the device 148. At a second step, the device 148 takes current and voltage measurements, calculates the power flowing through the device 148, which is 60 kW in this example because of the total load downstream of the device 146, and sends the power calculations for both of the devices 146 and 148 to the device 150. At a third step, the device 150 takes current and voltage measurements and calculates the power flowing through the device 150, which is 40 kW in this example. With the data collected by the device 150, the load in each of the sections 154, 156 and 158 can be calculated correctly at 50 kW, 20 kW and 40 kW.

If the device 148 receives the power of 110 kW flowing through the device 146, but before the device 148 can take a voltage and current measurement, a fault may occur in the section 158, which increases the power consumption in the section 158 by 50 kW. If this happens, in the second step when the device 148 takes the current and voltage measurements, it will include the extra consumption and its calculation of power flowing through itself, i.e., the device 148 will be 110 kW. In the third step when the device 150 takes the load measurements and tries to calculate the load in each of the sections 154, 156 and 158, the load for the section 154 will be incorrectly calculated as 0 kW because the device 150 thinks he power flowing through the device 146 is 110 kW, and the power flowing through the device 148 is also 110 kW. This miscalculation is caused by the fault. Using the measurement memory 68 and the median filter 74 as discussed in this disclosure, the outlier caused by the measurement mismatch in this example will be filtered out, and the resulting section loading will be the loading during normal conditions. That is what is desired for applications such as automatic fault restoration.

An alternative approach to solve the issue in this example is to reject any measurement that is associated with a fault. This requires additional rules and filtering criteria for identifying a fault, and it would be difficult to capture all of the possible fault scenarios. By contrast, the proposed approach using the measurement memory 68 and the median filter 74 does not need to specify such rules and criteria, and can reject other transient behaviors that may not be associated with faults.

In certain cases, such as when any one of the devices 146, 148 and 150 reports a loss of voltage, i.e., the voltage is below a predefined threshold, the measurements in the memory 68 should not be used for loading computations because the loads computed from such measurements may be incorrect. For this reason, this disclosure proposes that during a data dissemination period, if any device 146-150 reports loss of voltage, the latest measurements of the devices that have been sent to the control are discarded in the memory. When the control receives the measurements from the remaining devices during the same data dissemination period, those measurements are not accepted. After the retraction, since the memory 68 has the size of N+1, the median filter 74 for load computation still has enough measurements to compute the load using the median of the recent N measurements without disturbing events.

In the example discussed above, assume that after the second step, the feeder 144 loses power from the source 142. If memory retraction is not used, then after receiving (N+1)/2 measurements since the loss of voltage, the loads on all of the sections 154, 156 and 158 will be computed as zero. These are not the loads desired for the computation of automatic restoration. Using the mechanism in this proposal, when the source 142 is lost, at least one of the devices 146-150 will report a loss of voltage. Therefore, the latest measurements of this new period of data dissemination are discarded. Assuming the remaining recent measurements in the measurement memory are the same as referred to above, the load calculation will still be correct and reflect the load per section prior to the loss of voltage, which is desired. These desired loading values will stay the same even if the loss of voltage lasts for an extended time. This is because for every new dissemination period, the new measurements will not be recorded by the memory 68 due to the loss of voltage.

During changes in topology when the current may be coming from a different source, combining power flow measurements taken before and after the topology change will lead to erroneous load calculating results. In addition, topological changes, which typically follow a disturbance, may lead to a change in loading, for example, because a DG dropped offline. Therefore, when the control makes a change, or is aware of changes in topology that may directly change the section loads, it is faster to obtain the changed loads if the loading computation only uses the measurements after the change. When such control-aware changes occur, the control will clear the memory 68 by discarding the existing measurements and saving the updated measurement in the memory 68. At this point, the memory 68 will contain only one recent measurement. Note that before the memory 68 is filled with at least N measurements, the median filter 74 used for computing the loading can be applied to the fewer measurements in the memory 68. With the continuation of receiving updated measurements, the memory 68 will eventually be filled with N+1 recent measurements again.

If the memory 68 is not cleared after the control-aware changes, using the median filter 74, the new values would only be reflected after receiving more than (N+1)/2 updated measurements. That would take the time of (N+1)/2 periods of data dissemination. Moreover, if the change caused a significant increase in the section loads, the slow update would put the network at risk of overloading the power sources. One example is a DG, which is modeled as negative load. When a DG goes offline due to reasons such as fault protection of the main feeder, the control immediately knows this. The control then should assume that the section with the DG has a load of zero. If merely the measurement giving zero load was added to the memory 68, but the older measurements in the memory 68 were not cleared, then using the median filter 74, a fault restoration logic would think this section is still outputting power because of the negative load, and try to restore extra loads that should not be restored.

If at the end of a data dissemination period the control has not received the latest measurements from some devices, the loading computation using the median filter 74 proceeds unchanged. Immediately following the data loss, this may result in the load being computed from measurements taken at different data dissemination periods. However, assuming the load changes slowly relative to the data dissemination interval, this should result in negligible error in the load computation. Furthermore, after a few data dissemination periods with no communication contingency, the measurements in the memories 68 will realign automatically so that again loading will only be computed from measurements taken at the same data dissemination period.

If a certain device lost communications, the control in other devices or the control center 50 will not receive any updated measurements from that device. The loss of communications of that device should be detected by the control's communications layer or other methods such as a timer in the control. As soon as the control detects the loss of communications of the device, it computes and stores the ratio of the load magnitudes of the section on two sides of the device using the last updated loads of these sections. Later, when the control receives the updated measurements from devices other than the non-communicating device, it computes the combined load of the sections on two sides of the non-communicating device, and then it distributes the combined loads to the sections using the saved ratios from the last actual loads.

For example, in the network 10, if the device 30 lost communications, and the last computed loads of the section 40 and the section 42 are 40 kW and 20 kW, respectively, then the control stores the ratio of the loads between the section 40 and the section 42, which is 2:1. Then, with the topology information known to the control, it uses the measurements of the devices 28, 32 and 34 to compute the combined load of the section 40 and the section 42. If the combined load is 66 kW, then it records 44 kW for the load of the section 40 and 22 kW for the load of the section 42.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A method for representing a topology of a power distribution network, the network including at least one power source, a feeder and a plurality of switching devices positioned along the feeder and being in communications with each other, the network being represented by a plurality of teams where each team includes one side of adjacent switching devices and loads and power line sections therebetween, where each device includes a memory that stores a device list having its local device indices and a team list having its local team indices, the method comprising:
   identifying each of the switching devices with a unique local device index;
   identifying each of the teams with a unique local team index;
   providing a device list in each switching device that includes the local device index of each of the switching devices, the local team index of the team on an X-side of each of the switching devices, the local team index of the team on a Y-side of each of the switching devices and device specific data, wherein the X and Y-sides of the switching device is a physical orientation of the device when it is installed; and
   providing a team list in each switching device that includes the local team index of each of the teams, the local device indices of the switching devices on each team and team specific data, wherein the topology of the network can be obtained by either the device list or the team list.

2. The method according to claim 1 further comprising automatically updating and revising the device list and the team list by transmitting messages between and among the switching devices with information and data in the device list and the team list of one or more of the switching devices.

3. The method according to claim 2 wherein automatically updating and revising the device list and the team list occurs in response to devices being disconnected from, added to or removed from the network.

4. The method according to claim 3 wherein automatically updating and revising the device list and the team list includes manually identifying the immediate neighbor devices in a new switching device that is added to the network and manually identifying the new switching device in the immediate neighbor devices.

5. The method according to claim 2 wherein automatically updating and revising the device list and the team list includes obtaining data and information in received messages in each switching device about its neighbor devices, the neighbor devices of those devices and so on, until data and information has been received from all switching devices within the network.

6. The method according to claim 1 wherein each of the switching devices is further identified by a device ID, and wherein the device list in each of the switching devices further includes the ID of each of the devices.

7. The method according to claim 1 wherein the plurality of teams are defined as a division where the loads in the division are powered by a single power source and the division is separated from other divisions by normally open switching devices.

8. The method according to claim 1 wherein the device specific data includes voltage measurements, current measurements and open/close status and the team specific data includes amount of load on the team and whether there is a fault within the team.

9. The method according to claim 1 wherein the switching devices are reclosers, sectionalizers or circuit breakers.

10. A method for representing a topology of a power distribution network, the network including at least one power source, a feeder and a plurality of switching devices positioned along the feeder and being in communications with each other, where each device includes a memory that stores a device list having its local device indices and a team list having its local team indices, the method comprising:
    identifying each of the switching devices with a unique local device index; and
    providing a device list in each switching device that includes the local device index of each of the switching devices, identification of other switching devices on an X-side of each of the switching devices, identification of other switching devices on a Y-side of each of the switching devices and device specific data, wherein the X and Y-sides of the switching device is a physical orientation of the device when it is installed; and
    automatically updating and revising the device list by transmitting messages between and among the switching devices with information and data in the device list of one or more of the switching devices.

11. The method according to claim 10 wherein automatically updating and revising the device list occurs in response to devices being disconnected from, added to or removed from the network.

12. The method according to claim 11 wherein automatically updating and revising the device list includes manually identifying the immediate neighbor devices in a new switching device that is added to the network and manually identifying the new switching device in the immediate neighbor devices.

13. The method according to claim 10 wherein automatically updating and revising the device list includes obtaining data and information in received messages in each switching device about its neighbor devices and the neighbor devices of those devices.

14. The method according to claim 10 wherein each of the switching devices is further identified by a device ID, and wherein the device list in each of the switching devices further includes the ID of each of the devices.

15. The method according to claim 10 wherein the device specific data includes voltage measurements, current measurements and open/close status.

16. A system for representing a topology of a power distribution network, the network including at least one power source, a feeder and a plurality of switching devices positioned along the feeder and being in communications with each other, the network being represented by a plurality of teams where each team includes one side of adjacent switching devices and loads and power line sections therebetween, where each device includes a memory that stores a device list having its local device indices and a team list having its local team indices, the system comprising:

means for identifying each of the switching devices with a unique local device index;

means for identifying each of the teams with a unique local team index;

means for providing a device list in each switching device that includes the local device index of each of the switching devices, the local team index of the team on an X-side of each of the switching devices, the local team index of the team on a Y-side of each of the switching devices and device specific data, wherein the X and Y-sides of the switching device is a physical orientation of the device when it is installed; and means for providing a team list in each switching device that includes the local team index of each of the teams, the switching devices on each team and team specific data, wherein the topology of the network can be obtained by either the device list or the team list.

17. The system according to claim 16 further comprising means for automatically updating and revising the device list and the team list by transmitting messages between and among the switching devices with information and data in the device list and the team list of one or more of the switching devices.

18. The system according to claim 17 wherein the means for automatically updating and revising the device list and the team list updates and revises the device list and the team list in response to devices being disconnected from, added to or removed from the network.

19. The system according to claim 18 wherein the means for automatically updating and revising the device list and the team list manually identifies the immediate neighbor devices in a new switching device that is added to the network and manually identifies the new switching device in the immediate neighbor devices.

20. The system according to claim 18 wherein the means for automatically updating and revising the device list and the team list obtains data and information in received messages in each switching device about its neighbor devices and the neighbor devices of those devices.

* * * * *